United States Patent [19]

Fedaravichjus et al.

[11] Patent Number: 4,841,629
[45] Date of Patent: Jun. 27, 1989

[54] APPARATUS FOR THREADING A WIRE THROUGH MAGNETIC CORES OF A MEMORY MATRIX

[76] Inventors: Algimantas Y. Fedaravichjus, ulitsa Gvardechju, 98, kv.22.; Algis A. Kazla, ulitsa Topolju, 2, kv.I2.; Klemensas K. Rimshyalis, ulitsa 50-letia SSSR, 48, kv.68.; Kazimeras M. Ragulskis, ulitsa Donelaichio, I7, kv.2., all of Kaunas, U.S.S.R.

[21] Appl. No.: 82,378
[22] Filed: Aug. 6, 1987
[51] Int. Cl.$^4$ ............................................ H01F 41/08
[52] U.S. Cl. ...................................... 29/737; 29/241; 29/743; 29/744
[58] Field of Search .................. 29/737, 743, 744, 604, 29/241, 433; 226/143, 97

[56] References Cited
FOREIGN PATENT DOCUMENTS 598114 3/1978 U.S.S.R. .
1141448 2/1985 U.S.S.R. .

Primary Examiner—Carl E. Hall
Attorney, Agent, or Firm—Lilling & Greenspan

[57] ABSTRACT

An apparatus for weaving a wire through magnetic cores of a memory matrix include a housing accommodating a shaft connected to a rotation drive and having an axial passage and a cavity in its central portion, the interior of the cavity accommodating a spool of wire rotatable about its own axis and about an axis perpendicular to the shaft. The spool is provided with a step electric motor rigidly affixed on the shaft after the spool. At the side opposite to the arrangement of the step electric motor the housing accommodates a pneumatic transport unit having a central passage to allow the wire therethrough arranged in line with the axial passage of the shaft, walls of a guide having passages for feeding compressed gas to and discharging it from the central passage.

2 Claims, 1 Drawing Sheet

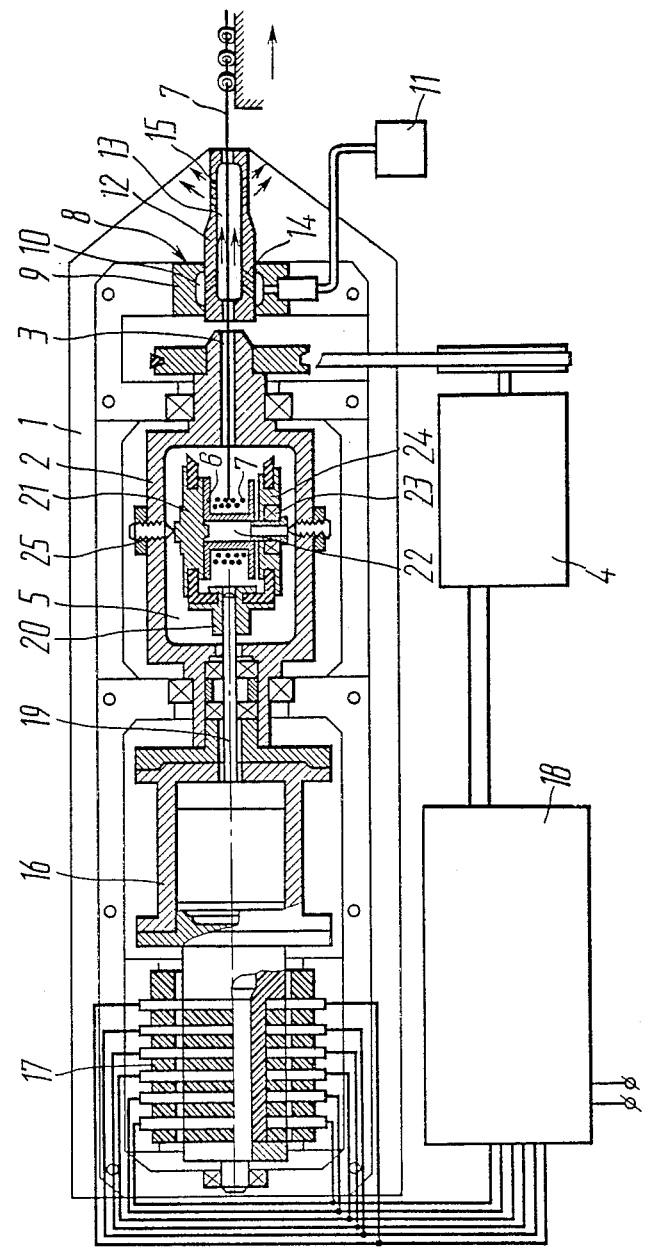

APPARATUS FOR THREADING A WIRE THROUGH MAGNETIC CORES OF A MEMORY MATRIX

BACKGROUND OF THE INVENTION

1. Field of the Invention

The present invention relates to apparatus for fabricating high-speed memory matrices, and more particularly to apparatus for threading a wire through magnetic cores of memory matrices. The invention can find application during manufacturing high-speed memory elements of electronic computers and other microprocessing equipment.

2. Description of the Prior Art

There is known an apparatus for threading a wire through magnetic cores of a memory matrix (cf., SU, A, 598,114) comprising a rotor-like shaft connected to a motor for imparting rotation thereto. The rotor-like shaft has secured thereto two step electric motors having shafts thereof connected to respective rollers to push a wire threaded therebetween, this wire being reeled off a spool secured inside the rotor-like shaft.

Transport of the wire is effected by the two rotating push rollers, which act to impart reciprocating movement to the wire. In addition, rotation is imparted to the wire about its axis by a rotation motor, which rotates the rotor-like shaft with the spool secured therein.

However, while executing the forced reciprocating movement, the wire is reeled off the freely rotating spool in jerks. It is for this reason that the wire is reeled off in a pulse-wise manner, whereby an excessive amount of the wire is reeled off the spool as compared with that necessitated by the rotating push rollers. As a result, the wire tends to form, in the space before the rollers and in the interior of the rotor-like shaft, loops and knots of wire slack to frequently cause jamming of the wire, which in turn requires that the apparatus be stopped. Further, this apparatus fails to ensure reversal of the wire and repeated feeding thereof in case the wire is jammed in the row of magnetic cores, or in case of faulty threading.

A technical solution which bears the closest resemblance to the one to be disclosed in the present description is exemplified in an apparatus for threading a wire through magnetic cores (cf., SU, A, 1,141,448) comprising a shaft accommodated inside a housing mounted on a base, a cartridge connected to the shaft and accommodating a spool of wire, and a guide for moving the wire arranged in line with the shaft between the cartridge and a table on which the magnetic cores are placed. In addition, the apparatus is provided with a pressure regulator to deliver compressed air to the housing and impart rotational movement to the shaft accommodating the cartridge with the spool and to the wire.

The wire is moved by compressed air fed to the guide for the compressed air to flow therethrough and convey the wire by forcing it away from the guide.

The wire is rotably reeled off the spool freely inside the cartridge. At the same time, the wire is also rotated, since the spool and cartridge are rotated by the shaft in turn rotatable by the action of compressed air fed from the pressure regulator.

One disadvantage of this prior art apparatus is that as the wire is subjected to the continuous action of a force providing for reeling the wire off the spool (the spool being mounted inside the cartridge for free rotation) the absence of a means for holding the spool against inadvertent rotation may result in the appearance of loops and knots of wire slack, which consequently causes jamming of the wire, necessitates termination of the threading operation and readjustment of the apparatus.

In addition, the continuous feeding of the wire and reeling the wire off the spool without means for holding the latter complicates the operation of the apparatus and causes loops and knots through the length of the line when the wire is jammed between the magnetic cores being woven. Therefore, the lack of reel off control means makes the apparatus less reliable in operation and necessitates inadvertent stoppages. This known apparatus also fails to control the speed of transport of the wire or transport reversal, when the wire is jammed in the row of magnetic cores or when faulty threading appears.

SUMMARY OF THE INVENTION

It is an object of the present invention to increase the efficiency and reliability of threading a wire through magnetic cores of a memory matrix.

The object of the invention is attained by an apparatus for threading a wire through magnetic cores of a memory matrix comprising a housing accommodating a shaft connected to a drive for rotating said shaft and having an axial passage and a cavity in its central portion in which there is disposed a spool for carrying wire to be threaded through said cores capable of rotation about its own axis and about an axis perpendicular to the shaft, and a pneumatic transport unit secured inside the housing before the shaft and including a guide having a central passage to allow the wire therethrough arranged in line with the axial passage of the shaft walls of the guide having passages for feeding compressed gas to and discharging it from the central passage. According to the invention, the spool is provided with a reversible drive rigidly affixed on said shaft for moving the wire, said reversible drive being arranged on the opposite side of the spool in relation to the pneumatic transport unit.

Preferably, used as the reversible drive for moving the wire is a step electric motor a shaft of which is connected through a tapered friction transmission to the spool, the step electric motor being electrically connected through a collector with a feeding and control unit.

In view of the foregoing, the provision, in the proposed apparatus for threading a wire through magnetic cores of a memory matrix, of a reversible drive for moving the wire, such as one having the form of a step electric motor, affords, thanks to varying the conditions for feeding the wire, higher operation efficiency of the apparatus and more reliable threading.

BRIEF DESCRIPTION OF THE DRAWINGS

The invention will now be described in greater detail with reference to a specific embodiment thereof taken in conjunction with the accompanying drawings, in which the sole FIGURE shows a general schematic view of an apparatus for threading a wire through magnetic cores of a memory matrix according to the invention.

DESCRIPTION OF THE PREFERRED EMBODIMENT

An apparatus for threading a wire through magnetic cores of a memory matrix comprises a housing 1 accommodating a shaft 2 having axial passages 3 and kinematically linked with an electric drive motor 4. In its central portion the shaft 2 has a cavity 5 accommodating a spool 6 of wire 7 capable of rotating about its own axis and about an axis perpendicular to the shaft 2. Arranged inside the housing 1 in front of and close to the shaft 2 is a pneumatic transport unit 8 comprising an annular feeder 9 having an interior 10 communicating with a source 11 of compressed air. The annular feeder 9 of the pneumatic transport unit 8 embraces a guide 12 with a central passage 13 through which the wire 7 is threaded disposed in line with the axial passage 3 of the shaft 2. The walls of the guide 12 have passages 14 to deliver compressed air to the central passage 13 communicating with the interior 10 of the annular feeder 9, and passages 15 to discharge compressed air from the central passage 13. Fixedly secured on the shaft 2 at the side opposite to the arrangement of the pneumatic transport unit 8 is a reversible drive for reeling off the wire 7 connected to the spool 6. Used as the reversible drive for reeling off the wire is an electric step motor 16 electrically wired through a collector 17 to a feeding and control unit 18. This unit 18 is also connected to the drive motor 4. A shaft 19 of the step motor 16 is linked through a tapered friction transmission with the spool 6, a drive wheel 20 of the tapered friction transmission being secured on the shaft 19 of the step motor engageable with a driven wheel 21 a shaft 22 of which has the spool 6 rigidly affixed tension, whereas journalled in bearings 23 under the spool 6 is a balancing wheel 24. The balancing wheel 24 likewise engages with the drive wheel 20, the driven wheel 21 and the balancing wheel 24 rotating in the opposite directions. The driven wheel 21 and the balancing wheel 24 are secured in centers 25 of the shaft 2 providing rotation of the spool 6 in a plane perpendicular to the axis of the shaft 2.

The apparatus for threading a wire through magnetic cores of a memory matrix operates in the following manner. The apparatus is placed before magnetic cores to be threaded. The wire 7 is reeled off the spool 6, threaded through the axial passage 3 of the shaft 2, central passage 13 of the guide 12 of the pneumatic transport unit 8, and forced from the housing 1. Compressed air is admitted to the interior 10 of the annular feeder 9 from the source 11 of compressed air for the latter to be fed through the passages 14 to the central passage 13 of the guide 12. While flowing toward the discharge passages 15, the compressed air produces a pushing force necessary for ensuring transport of the wire 7. At the same time, the drive motor 4 acts to rotate the shaft 2 carrying the spool 6, whereby the spool 6 having the wire 7 wound thereon is caused to rotate in a plane perpendicular to the axis of the shaft 2, the step motor 16 rigidly secured on the shaft 2 also being rotated. This is accompanied by rotation of the collector 17 through which the step motor 16 is energized.

Rotational movement imparted to the shaft 2 with the spool 6 provides rotation of the wire 7 to result in increased longitudinal rigidity of the wire 7 and improved conditions for weaving the magnetic cores.

Simultaneously with the movement of the wire 7 under the action of compressed air and twisting of the wire ensured by rotation of the shaft 2, the feeding and control unit 18 issues an electrical signal to the step motor 16 which rotates the shaft 19 of the step motor 16. Rotation is transmitted from the shaft 19 to the drive wheel 20 of the tapered friction transmission and therefrom to the drive wheel 21 and shaft 22 of the driven wheel 21 on which the spool 6 with the wire 7 is fitted.

In view of the foregoing, the wire 7 is drawn by the action of compressed air fed to the guides 12, twisted due to rotation of the shaft 2, and moved intermittently by the step motor 16. By preselecting such parameters as the force with which the wire 7 is drawn by compressed air, the speed of movement of the wire 7, as well as the frequency, duration of operation and amplitude of the step motor 16, the wire 7 is reeled off the spool 6 without a slack, which prevents the formation of loops and knots of the wire 7 and ensures controlled feed rate thereof.

In the case the wire 7 suddenly jams, or when the wire 7 is to be returned, the feeding and control unit 18 delivers a signal to deenergize the step motor 16. Subsequent to stopping the step electric motor 16 a signal is delivered from the unit 18 to reverse the motor 16, whereby the drive wheel 20 of the friction transmission, while rotating the driven wheel 21 and the spool 6 in the reverse direction, acts to take up excess wire 7 and draw the wire from the row of magnetic cores to execute repeated threading. Because the rate of drawing the wire 7 under the action of compressed air is sufficiently high and normally amounts to between 0.5 and 0.75 m/s, the additional intermittent translational movement executed by the step electric motor 16 sets the required rate of threading the magnetic cores and return of the wire 7 after reversing the action of the step electric motor 16.

In view of the foregoing, the proposed construction of the apparatus for threading a wire through magnetic cores of a memory matrix ensures a higher rate and more reliable threading due to provision for varying the feed rate of the wire.

What is claimed is:

1. An apparatus for threading a wire through magnetic cores of a memory matrix comprising a housing; a shaft provided with an axial passage, accommodated inside said housing and having a cavity in its central portion; a drive for rotating said shaft; a spool for carrying wire to be threaded through said cores accommodated inside said cavity of said shaft mounted for rotation about its own axis and about an axis perpendicular to said shaft; a pneumatic transport unit disposed inside said housing before said shaft and including a guide with a central passage to allow said wire therethrough arranged in line with said axial passage of said shaft, walls of said guide having passages for feeding compressed gas to said central passage of said guide and passages for discharging compressed gas from said central passage of said guide; a reversible drive rigidly affixed on said shaft for moving the wire on said spool, said reversible drive being arranged on the opposite side of the spool in relation to said pneumatic transport unit.

2. An apparatus as defined in claim 1, in which used as said reversible drive for moving the wire is a step electric motor having a shaft and comprising a tapered friction transmission connecting said shaft of said step electric motor to said spool; a collector; a feeding and control unit electrically connected through the collector with said step electric motor.

* * * * *